United States Patent [19]

Tomimatsu et al.

[11] Patent Number: 4,846,579

[45] Date of Patent: Jul. 11, 1989

[54] FREQUENCY-VOLTAGE CONVERTING CIRCUIT

[75] Inventors: Noriyuki Tomimatsu; Akihiko Tsurishima, both of Nagasaki, Japan

[73] Assignee: Mitsubishi Denki Kabushiki Kaisha, Tokyo, Japan

[21] Appl. No.: 241,306

[22] Filed: Sep. 7, 1988

[30] Foreign Application Priority Data

Sep. 10, 1987 [JP] Japan .................................. 62-228833

[51] Int. Cl.[4] ............................................. G01R 23/06
[52] U.S. Cl. ........................................ 363/8; 307/273; 307/353; 328/140; 328/151
[58] Field of Search .................... 363/8, 157; 307/246, 307/261, 264, 273, 353; 328/191, 207, 160, 151

[56] References Cited

U.S. PATENT DOCUMENTS

| | | | |
|---|---|---|---|
| 3,244,959 | 4/1966 | Thompson et al. | 363/8 |
| 3,986,055 | 10/1976 | Barzely | 328/140 |
| 4,031,532 | 6/1977 | First | 328/140 |
| 4,166,248 | 8/1979 | Bianchi et al. | 307/353 |
| 4,214,299 | 7/1980 | Nakagaki et al. | 363/8 |
| 4,222,095 | 9/1980 | Stein | 328/140 |
| 4,446,439 | 5/1984 | Mizumoto et al. | 328/140 |
| 4,605,901 | 8/1986 | Kobori et al. | 328/140 |

Primary Examiner—Peter S. Wong
Attorney, Agent, or Firm—Burns, Doane, Swecker & Mathis

[57] ABSTRACT

A quick-response frequency-voltage converting circuit which generates a voltage signal responding to a reciprocal of the period of an input signal, and sample-holds this voltage signal at the end of one period, and thereby can obtain a voltage responding to the frequency of the input signal in one period.

2 Claims, 2 Drawing Sheets

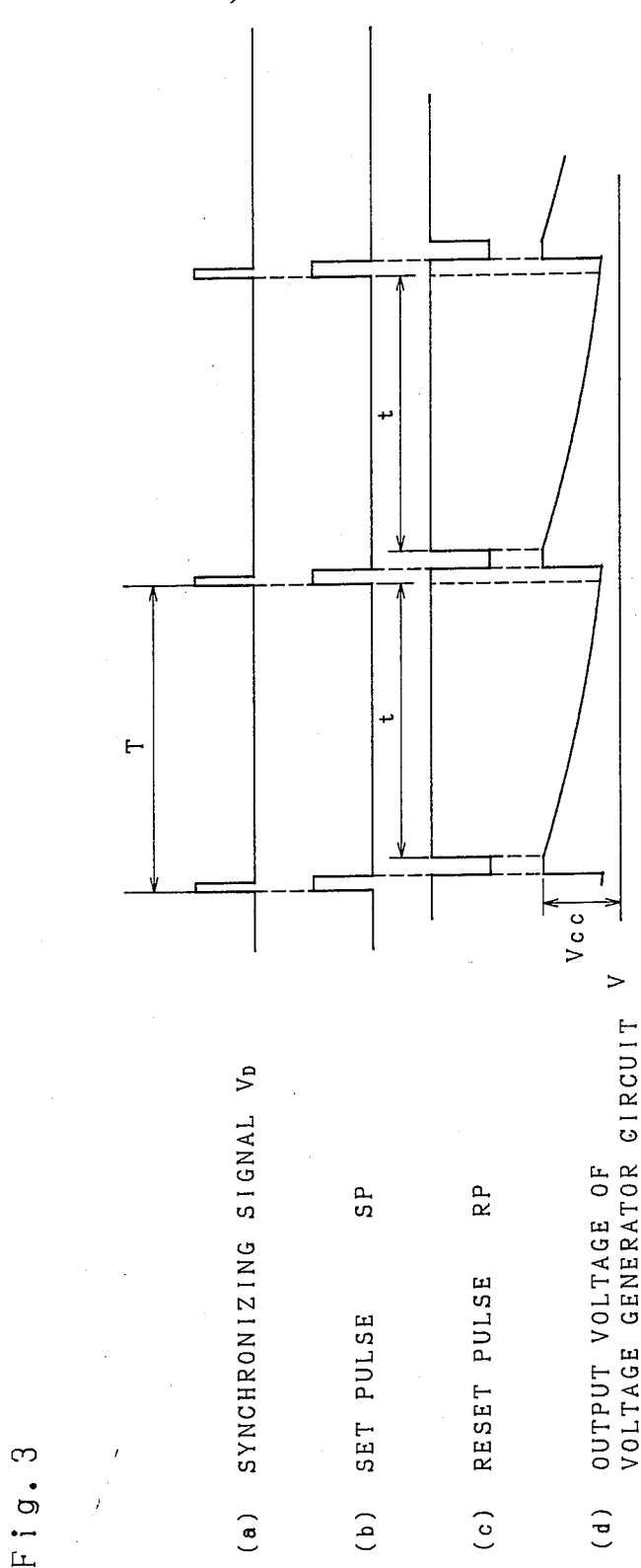

4,846,579

FREQUENCY-VOLTAGE CONVERTING CIRCUIT

BACKGROUND OF THE INVENTION

1. Field of the Invention

The present invention relates to a frequency-voltage converting circuit outputting a voltage responding to an inputted frequency, and specifically relates to a frequency-voltage converting circuit having an improved response characteristic.

2. Description of the Prior Art

FIG. 1 is a circuit diagram of a conventional frequency-voltage circuit (hereinafter referred to as F-V converting circuit) used for a display monitor. In the figure, $V_D$ is a synchronizing signal, and this synchronizing signal $V_D$ is given to a trigger input pin of a monostable multivibrator 1. The output terminal of the monostable multivibrator 1 is connected to one end of a resistor R, and the other end thereof is grounded through a capacitor C, and the node of the capacitor C and the resistor R becomes an output terminal of an output voltage $V_O$ nearly proportional to the frequency of the synchronizing signal $V_D$, that is, nearly inversely proportional to the period.

Next, description is made on operation. The pulse width of the inputted synchronizing signal $V_D$ is determined at a constant length by the monostable multivibrator 1. Thereafter, the signal $V_D$ is smoothed by the smoothing capacitor C, and the smoothing resistor R, and thus the output voltage $V_O$ proportional to the frequency of the synchronizing signal can be obtained.

In the conventional F-V converting circuits, the response is slow due to the time constant of the smoothing capacitor C and the smoothing resistor R, and problems of disturbance of screen display and the like until a predetermined voltage is obtained are left unsolved.

SUMMARY OF THE INVENTION

The present invention has been achieved to eliminate the problems as mentioned above, and an object thereof is to obtain a quick-response F-V converting circuit by sample-holding a voltage nearly proportional to the reciprocal of the period of the input signal at a predetermined timing in one period.

The above and further objects and features of the invention will more fully be apparent from the following detailed description with accompanying drawings.

BRIEF DESCRIPTION OF THE DRAWINGS

FIG. 3 is a timing chart explaining operation of the F-V converting circuit in accordance with the present invention.

DESCRIPTION OF THE PREFERRED EMBODIMENT

Hereinafter, description is made on one embodiment in accordance with the present invention in reference to the drawings.

Figure 1:
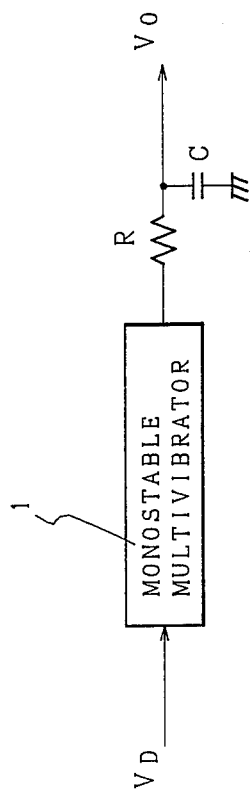
FIG. 1 is a circuit diagram of a conventional F-V converting circuit.
Figure 2:
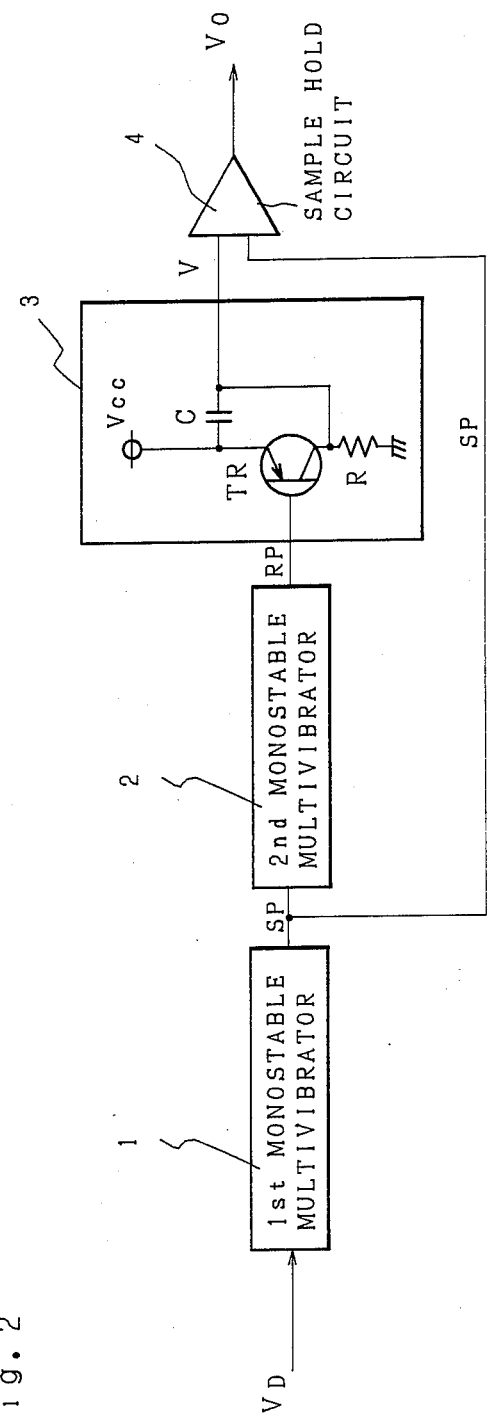
FIG. 2 is a circuit diagram showing one embodiment of a F-V converting circuit in accordance with the present invention.

In FIG. 2, numeral 1 designates a first monostable multivibrator 1, and a synchronizing signal $V_D$ is given to this first monostable multivibrator 1 as a trigger signal, and the first monostable multivibrator 1 outputs by this signal $V_D$ a set pulse SP having a predetermined pulse width. The outputted set pulse SP is given to a second monostable multivibrator 2 being triggered at the end of the set pulse SP, and outputting a reset pulse RP having reverse polarity to the set pulse SP and a predetermined pulse width. The outputted reset pulse RP is given to the base of a PNP transistor TR of a voltage generator circuit 3. For each of the pulse width of the set pulse SP and the reset pulse RP, a sufficiently short time is set in comparison with a period T of the synchronizing signal $V_D$ to be detected. The collector of the PNP transistor TR is grounded through a resistor R, and the emitter thereof is connected to the power source terminal and is given a power source voltage $V_{CC}$. Also, the power source voltage $V_{CC}$ is inputted to the sample signal input terminal of a sample hold circuit 4 through a capacitor C. Furthermore, the collector of the PNP transistor TR is also inputted to the sample signal input terminal of the sample hold circuit 4. The voltage generator circuit 3 is constituted with the above-mentioned transistor TR, capacitor C and resistor R.

On the other hand, the set pulse SP of the first monostable multivibrator 1 is given to the hold signal input terminal of the sample hold circuit 4. Then, when the set pulse SP is inputted, an output voltage of the voltage generator circuit 3 is sample-held, and is outputted to the output terminal as an output voltage $V_O$.

Next, description is made on operation.

FIG. 3 is a waveform diagram explaining operation of the F-V converting circuit.

The synchronizing signal $V_D$ is inputted to the trigger terminal of the first monostable multivibrator 1, and the set pulse SP is generated. This set pulse SP is inputted as a trigger input signal of the second monostable multivibrator 2 and the hold signal of the sample hold circuit 4. The second monostable multivibrator 2 generates the reset pulse RP of reverse polarity at the end of the set pulse SP.

In the voltage generator circuit 3, the PNP transistor TR is turned on at the front end of the reset pulse RP and is turned off at the rear end. When the transistor TR is turned on, the output voltage $V_O$ rises to the power source voltage $V_{CC}$, and at off-timing discharge is performed gradually at a time constant of RC, and the voltage drops. This means that, taking a time from the reset pulse RP as t and an output voltage as V, a voltage V expressed by a function, $V \approx K/t$ (K: constant), is generated, and is reset at the front end of the next reset pulse RP. This means that the voltage rises to the power source voltage $V_{CC}$. (Refer to FIG. 3d). In this example of circuit diagram, a CR charging circuit is used, and in a required frequency band, an expression $V \approx K/t$ is approximated. The sample hold circuit 4 holds the output voltage of this voltage generator circuit 3 at the point of detection of the front end of the set pulse SP.

Thus, taking a period of the synchronizing signal as T, the output voltage $V_O$ of the sample hold circuit 4 is given by $V_O = K/T$. Because of $T = 1/f$, $V_O = kf$ holds, and a voltage proportional to the frequency of the synchronizing signal can be obtained.

As described above, in accordance with the present invention, a voltage proportional to the input frequency is obtainable in one period, and therefore a frequency-voltage converting circuit having a very quick response can be realized.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within meets and bounds of the claims, or equivalence of such meets and bounds thereof are therefore intended to be embraced by the claims.

What is claimed is:

1. A frequency-voltage converting circuit comprising,
   a first monostable multivibrator which is triggered by an input signal and generates a set pulse;
   a second monostable multivibrator which is connected to the output terminal of said first monostable multivibrator, and is triggered in synchronism with said set pulse, and generates a reset pulse;
   a voltage generator circuit which generates a voltage responding to a reciprocal of the period of said input signal after extinction of said reset pulse; and
   a sample-hold circuit which holds and outputs an output voltage of said voltage generator circuit in synchronism with said set pulse from said first monostable multivibrator.

2. A frequency-voltage converting circuit comprising as set forth in claim 1, wherein said voltage generator circuit comprises a switching device which is turned on or off in response to said reset pulse, a capacitor being connected in parallel with said switching device, one end thereof is connected to a power source terminal, and a resistor which is connected to the other end of said capacitor, and is grounded.

* * * * *